(12) United States Patent
Lowrey

(10) Patent No.: US 7,326,952 B2
(45) Date of Patent: Feb. 5, 2008

(54) ELEVATED PORE PHASE-CHANGE MEMORY

(75) Inventor: Tyler A. Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 38 days.

(21) Appl. No.: 10/839,311

(22) Filed: May 5, 2004

(65) Prior Publication Data

US 2004/0202033 A1   Oct. 14, 2004

Related U.S. Application Data

(62) Division of application No. 09/944,478, filed on Aug. 31, 2001, now Pat. No. 6,764,894.

(51) Int. Cl.
    *H01L 29/04* (2006.01)
(52) U.S. Cl. ............... 257/3; 257/4; 257/E45.002
(58) Field of Classification Search ........... 257/2–5, 257/E45.002
    See application file for complete search history.

(56) References Cited

U.S. PATENT DOCUMENTS 5,166,758 A     11/1992  Ovshinsky et al.
5,837,564 A  *  11/1998  Sandhu et al. ............... 438/95
6,031,287 A  *   2/2000  Harshfield ................... 257/734
6,117,720 A  *   9/2000  Harshfield ................... 438/238
2002/0017701 A1*  2/2002  Klersy et al. ............... 257/536
2003/0122156 A1*  7/2003  Maimon ....................... 257/200

FOREIGN PATENT DOCUMENTS

WO      WO/00/57498    *  9/2000

* cited by examiner

*Primary Examiner*—T. N. Quach
(74) *Attorney, Agent, or Firm*—Trop, Pruner & Hu, P.C.

(57) ABSTRACT

An elevated phase-change memory cell facilitates manufacture of phase-change memories by physically separating the fabrication of the phase-change memory components from the rest of the semiconductor substrate. In one embodiment, a contact in the substrate may be electrically coupled to a cup-shaped conductor filled with an insulator. The conductor couples current up to the elevated pore while the insulator thermally and electrically isolates the pore.

14 Claims, 4 Drawing Sheets

ELEVATED PORE PHASE-CHANGE MEMORY

This is a divisional of prior application Ser. No. 09/944,478, filed Aug. 31, 2001 now U.S. Pat. No. 6,764,894.

BACKGROUND

This invention relates generally to memories that use phase-change materials.

Phase-change materials may exhibit at least two different states. The states may be called the amorphous and crystalline states. Transitions between these states may be selectively initiated in response to temperature changes. The states may be distinguished because the amorphous state generally exhibits higher resistivity than the crystalline state. The amorphous state involves a more disordered atomic structure and the crystalline state involves a more ordered atomic structure. Generally, any phase-change material may be utilized. In some embodiments, however, thin-film chalcogenide alloy materials may be particularly suitable.

The phase-change may be induced reversibly. Therefore, the memory may change from the amorphous to the crystalline state and may revert back to the amorphous state thereafter or vice versa. In effect, each memory cell may be thought of as a programmable resistor that reversibly changes between higher and lower resistance states.

In some situations, a cell may have a large number of states. That is, because each state may be distinguished by its resistance, a number of resistance determined states may be possible, allowing the storage of multiple bits of data in a single cell.

A variety of phase-change alloys are known. Generally, chalcogenide alloys contain one or more elements from column VI of the periodic table. One particularly suitable group of alloys are GeSbTe alloys.

A phase-change material may be formed within a passage or pore defined through a dielectric material. The phase-change material may be coupled to contacts on either end of the passage. State transitions may be induced by applying a current to heat the phase-change material.

An access device may be defined in the substrate of a semiconductor integrated circuit to activate an overlying phase-change material. Other phase-change memory components may also be integrated into the semiconductor substrate. Patterning features over integrated topography may adversely impact the underlying integrated features. Thus, it would be desirable to form the phase-change memory in a fashion, above the rest of the integrated circuit, that does not interfere with any of the previously fabricated integrated structures.

Another issue with phase-change memories is that the greater the heat loss from each memory cell, the greater the current that must be applied for device programming. Thus, it would be desirable to reduce the amount of heat loss from the heated phase-change material. Similarly, it is desirable to distribute the heat homogenously across the phase-change material. However, many currently proposed techniques result in local variations in device resistance after a programming event. These local variations may also result in stress in local regions during the phase-change programming.

It would be desirable to reduce the cell size as much as possible to thereby reduce product cost. Also it would be desirable to reduce the number of manufacturing steps to the greatest possible extent, to reduce costs.

Thus, there is a need for improved phase-change memories and techniques for making the same.

DETAILED DESCRIPTION

Figure 1:
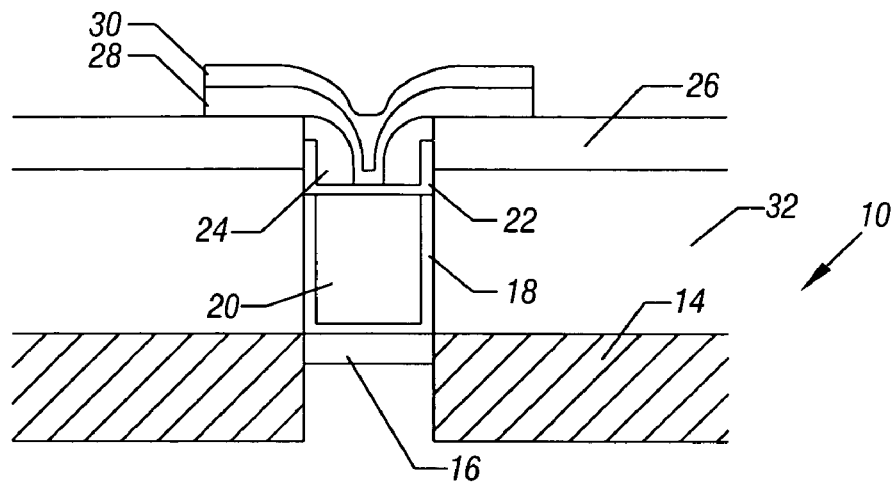
FIG. 1 is an enlarged cross-sectional view of one embodiment of the present invention.

Referring to FIG. 1, a phase-change memory cell 10 may include an elevated pore in accordance with one embodiment of the present invention. A substrate 12 may include an integrated circuit including access transistors (not shown) that control the current through a base contact 16. A shallow trench isolation structure 14 may isolate the memory cell 10 from the remainder of the structures formed in the substrate 12. Over the substrate 12, is a liner conductor 18 in accordance with one embodiment of the present invention. The liner conductor 18 may be tubular and cup-shaped and may define an open central region that may be filled with a fill insulator 20 in accordance with one embodiment of the present invention. The liner conductor 18 conducts current from the base contact 16 upwardly to an elevated pore.

The elevated pore includes a resistive or lower electrode 22 that may also be tubular and cup-shaped. Within the interior of the lower electrode 22 is a pore defined by a pair of opposed spacers 24 and a phase-change layer 28. The phase-change layer 28 also may be cup-shaped and may be filled with an upper electrode 30 in one embodiment of the present invention. The upper electrode 30 and the phase-change material 28 may be patterned in one embodiment of the present invention.

Figure 2A:
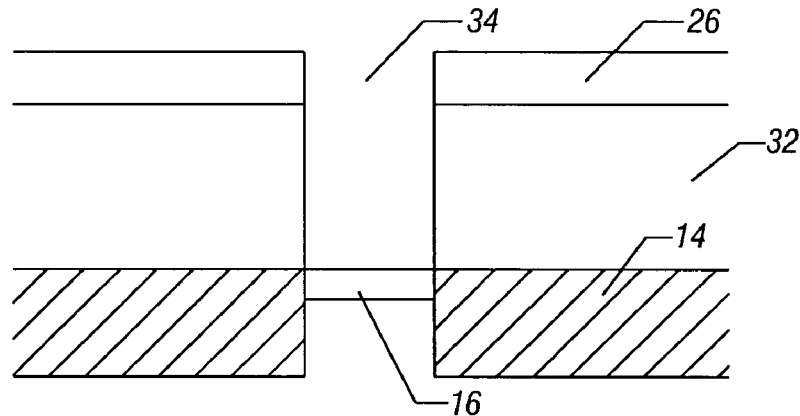
FIGS. 2A through 2I are enlarged cross-sectional views of a process for manufacturing the device shown in FIG. 1 in accordance with one embodiment of the present invention.

Referring to FIG. 2A, the process of forming the structure shown in FIG. 1 begins by forming a pore 34 through an etch stop layer 26 and a dielectric layer 32. The etch stop layer 26 may be of a material that is less prone to being etched relative to a variety of surrounding layers. In one embodiment, the etch stop layer 26 may be silicon nitride or $Si_3N_4$.

Figure 2B:
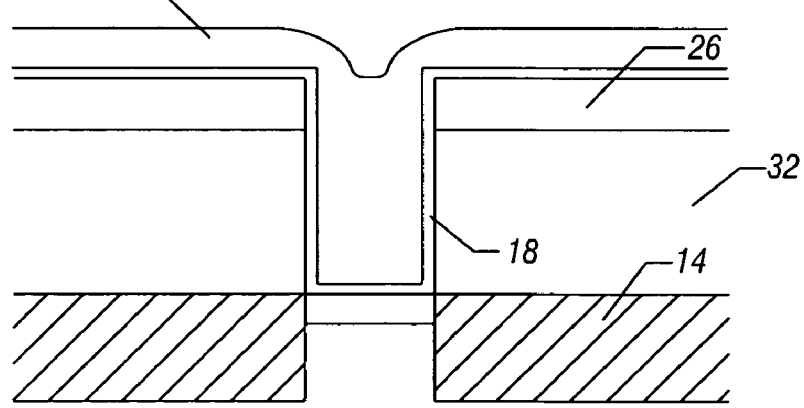

Moving to FIG. 2B, a liner conductor 18 may be deposited within the pore 34 in one embodiment of the present invention. The liner conductor 18 may be titanium, titanium nitride, Tungsten or a combination of these materials in some embodiments. The liner conductor 18 lines the cylindrical pore 34 and may be filled with a fill material 20. Advantageously, the liner conductor 18 is conformal, with consistent coverage on the sidewalls of the pore 34. The fill material 20 provides thermal and electrical isolation. In one embodiment, the fill material 20 may be silicon dioxide.

Figure 2C:
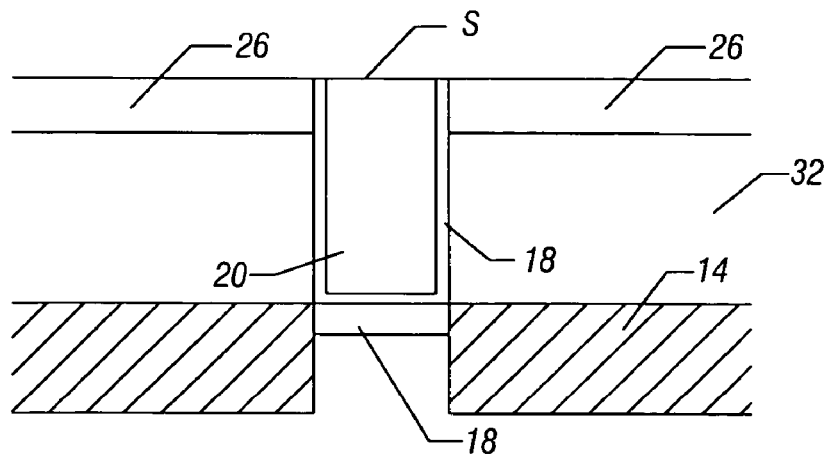

Turning next to FIG. 2C, the structure shown in FIG. 2B may be planarized. In one embodiment of the present invention a chemical mechanical planarization (CMP) process may be utilized to create the planar surface indicated as S. The etch stop layer 26 may be used to provide a well controlled final stopping point for the planarization.

Figure 2D:
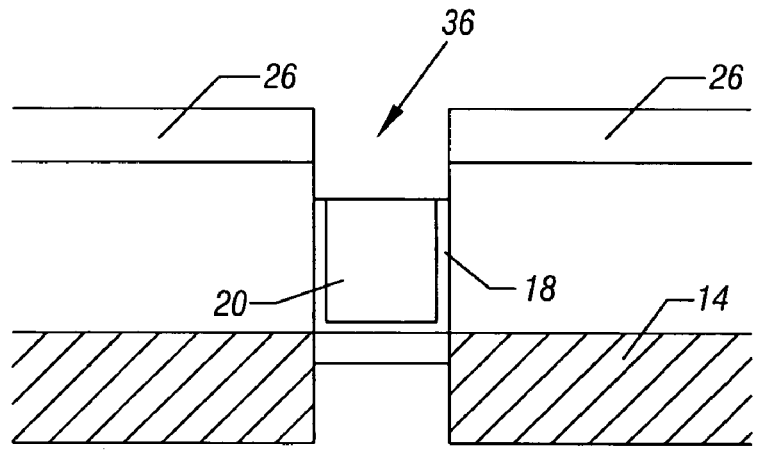

As shown in FIG. 2D, the fill material 20 is subjected to an etch of controlled distance. Thus, an opening 36 is formed of a controlled depth. In one embodiment of the present invention, the etch of the fill material 20 may be done with a dry insulator etch. This may be followed by an etch of the liner conductor 18. In one embodiment, the liner conductor 18 may be etched isotropically with minimal overetch. In one embodiment, the liner conductor 18 may be etched using a wet etch following the etch of the fill material 20.

Figure 2E:
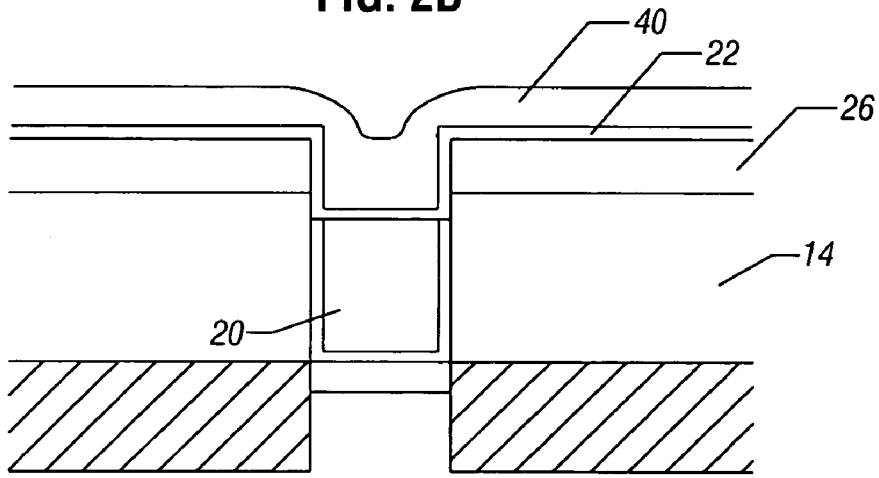

Next, a resistive or lower electrode 22 may be deposited in one embodiment of the present invention, as shown in FIG. 2E. The opening 36 in the upper surface of the etch stop 26 may be covered with the lower electrode 22. The electrode 22 may then be covered with an insulator 40. The lower electrode 22 makes an electrical connection to the liner conductor 18 that in turn makes an electrical connection to the contact 16 in the substrate 12.

Figure 2F:
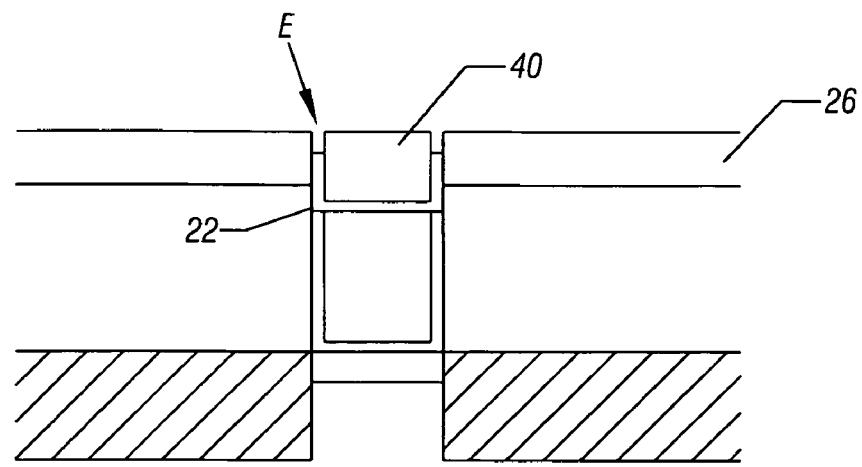

The structure shown in FIG. 2E is then subjected to a planarization process such as CMP, to produce the planarized structure shown in FIG. 2F. The liner conductor 18 is then subjected to a recess etch to form the recessed regions indicated at E. In one embodiment, the recess etch may be a short wet etch.

Figure 2G:
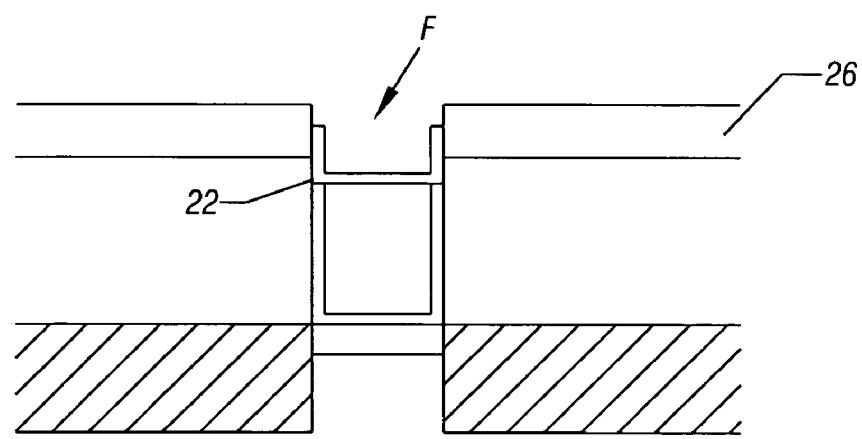
Figure 2H:
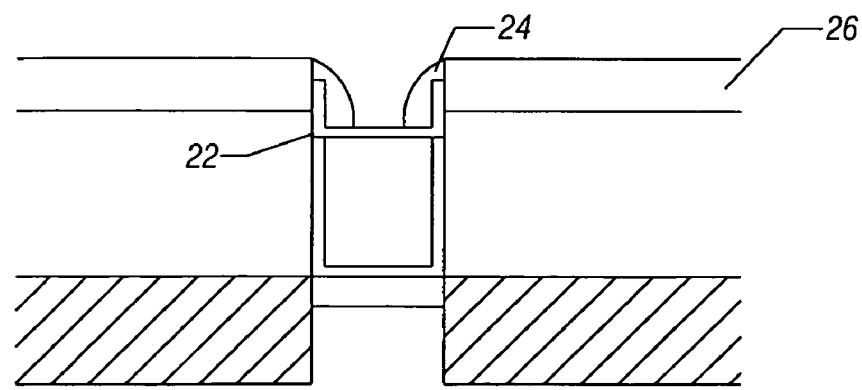

Thereafter, the insulator 40 may be removed using an etching process, such as a dry or wet insulator etch, to produce the pore indicated as F, as shown in FIG. 2G, with the lower electrode 22 exposed. Thereafter, a sidewall spacer 24 may be formed as shown in FIG. 2H. The spacer 24 may be formed conventionally, for example by depositing an insulator material and then anisotropically etching the deposited insulator material. In one embodiment, the sidewall spacer 24 may be silicon nitride or silicon dioxide.

Figure 2I:
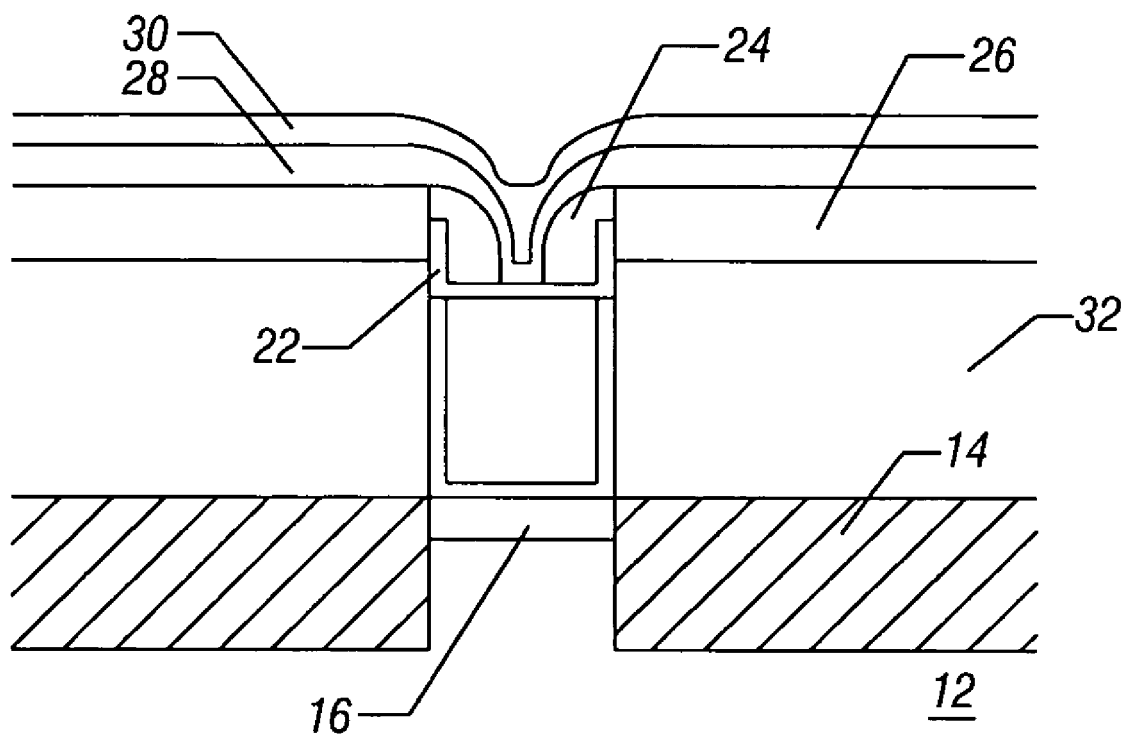

Then, as shown in FIG. 2I, the structure shown in FIG. 2H may be covered by a phase-change layer 28 and an upper electrode layer 30. In one embodiment, the phase-change layer 28 is cup-shaped and extends downwardly into the pore defined by the spacer 24 on the sides and the lower electrode 22 on the bottom. In one embodiment, the phase-change material may be $Ge_2Sb_2Te_5$.

The upper electrode 28 may be a sandwich of a plurality of layers. In one embodiment, the sandwich may include, starting at the bottom, titanium, followed by titanium nitride followed by aluminum.

An electrical connection may be established from the base contact 16 in the substrate 12 through the liner conductor 18 to the lower electrode 22 and then to the phase-change layer 28. Finally in some embodiments, the phase-change layer 28 and upper electrode 30 may be patterned to achieve the structure shown in FIG. 1 in some embodiments.

In some embodiments, elevating the pore above the substrate 12 facilitates the integration of the phase-change memory cell into standard complementary metal oxide semiconductor (CMOS) process flows. In particular, elevating the pore avoids patterning features on integrated circuit topography in the substrate 12. Photolithographic steps may be on planarized surfaces as a result.

In some embodiments, a thermally efficient device structure provides for improved device performance by reducing the required power for device programming. The programmable media volume, represented by the phase-change layer 28, is nearly surrounded by thermal insulation.

The lower electrode 22 provides the heat for producing phase changes at lower currents. The lower electrode 22 may be made relatively thin, reducing heat loss through the electrode 22 in some embodiments. In addition, in some embodiments, temperature distribution is more homogeneous during programming providing for less local variation in device resistance after programming. This structure may also result in developing less stress in local regions when invoking a phase change, in some embodiments.

Likewise, in some embodiments, cell size may be reduced, thereby reducing product cost. Only two additional masking steps may be required to form the structure, in some embodiments, also reducing costs and shortening process cycle times.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a semiconductor structure;
   a base contact formed on said semiconductor structure;
   an insulating layer over said semiconductor structure;
   a passage formed through said insulating layer, said passage including a tubular electrical connection to said base contact;
   an insulator within said connection;
   a cup-shaped heater electrically coupled to said connection; and
   a phase-change material electrically coupled to said contact through said electrical connection and said heater.

2. The memory of claim 1 wherein said electrical connection is cup-shaped.

3. The memory of claim 1 including a sidewall spacer on said cup-shaped heater.

4. The memory of claim 3 wherein the phase-change material is formed over said sidewall spacer and in contact with said heater.

5. The memory of claim 1 wherein said heater is recessed below the upper surface of said insulating layer.

6. The memory of claim 5 including an upper electrode over said phase-change material.

7. A memory comprising:
   a semiconductor structure;
   a phase-change material spaced above said semiconductor structure;
   a pair of stacked cup-shaped connectors electrically coupling said phase-change material to said semiconductor structure; and
   an insulator between said cup-shaped connectors.

8. The memory of claim 7 including an insulating layer over said semiconductor structure.

9. The memory of claim 8 including a passage formed through said insulating layer.

10. The memory of claim 9 wherein said passage is lined with said stacked cup-shaped connectors.

11. The memory of claim 7 including a base electrode electrically coupled to said phase-change material and said connectors.

12. The memory of claim 7 including a sidewall spacer over one of said connectors and under said phase-change material.

13. The memory of claim 12 wherein said sidewall spacer is positioned within said passage and wherein said sidewall spacer is cylindrical.

14. The memory of claim 13 including an upper electrode over said phase-change material.

* * * * *